(12) United States Patent
Kato (10) Patent No.: US 8,603,897 B2
(45) Date of Patent: Dec. 10, 2013

(54) METHOD FOR MANUFACTURING BONDED WAFER

(75) Inventor: Tadahiro Kato, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/519,218

(22) PCT Filed: Dec. 27, 2010

(86) PCT No.: PCT/JP2010/007545
§ 371 (c)(1),
(2), (4) Date: Jun. 26, 2012

(87) PCT Pub. No.: WO2011/092795
PCT Pub. Date: Aug. 4, 2011

(65) Prior Publication Data
US 2012/0289025 A1 Nov. 15, 2012

(30) Foreign Application Priority Data
Jan. 28, 2010 (JP) .................................. 2010-016913

(51) Int. Cl.
*H01L 21/30* (2006.01)
*H01L 21/46* (2006.01)

(52) U.S. Cl.
USPC .................................. 438/459; 257/E21.567

(58) Field of Classification Search
USPC .................................. 438/459; 257/E21.567
See application file for complete search history.

(56) References Cited

U.S. PATENT DOCUMENTS
2009/0252944 A1  10/2009  Kurita et al.

FOREIGN PATENT DOCUMENTS

| | | |
|---|---|---|
| EP | 1 962 325 A1 | 8/2008 |
| EP | 2 033 739 A1 | 3/2009 |
| JP | A-3-83320 | 4/1991 |
| JP | A-8-97111 | 4/1996 |
| JP | A-2003-151939 | 5/2003 |
| JP | A-2006-253595 | 9/2006 |
| JP | A-2007-214256 | 8/2007 |
| JP | A-2009-253143 | 10/2009 |

OTHER PUBLICATIONS

Translation of Sep. 18, 2012 International Preliminary Report on Patentability issued in International Patent Application No. PCT/JP2010/007545.
International Search Report issued in International Application No. PCT/JP2010/007545 on Mar. 29, 2011 (with translation).
May 31, 2013 Extended Search Report issued in European Patent Application No. 10844562.8.
Sep. 10, 2013 Office Action issued in Japanese Patent Application No. 2010-016913 (with partial translation).

*Primary Examiner* — David S Blum
(74) *Attorney, Agent, or Firm* — Oliff & Berridge, PLC (57) ABSTRACT

A method for manufacturing a bonded wafer including bonding together a bond wafer and a base wafer each having a chamfered portion at an outer circumference and thinning the bond wafer, wherein the thinning of the bond wafer includes: a first step of performing surface grinding on the bond wafer such that a thickness of the bond wafer reaches a first predetermined thickness; a second step of removing an outer circumference portion of the ground bond wafer; and a third step of performing surface grinding on the bond wafer such that the thickness of the bond wafer reaches a second predetermined thickness.

8 Claims, 6 Drawing Sheets

METHOD FOR MANUFACTURING BONDED WAFER

TECHNICAL FIELD

The present invention relates to a method for manufacturing an SOI (Silicon On Insulator) wafer and the like by bonding together wafers, and more particularly to a method for manufacturing an SOI wafer in which the outer circumference portion of a bond wafer is inhibited from being chipped after bonding in manufacture of an SOI wafer having a thick SOI layer of 50 µm or more.

BACKGROUND ART

As wafers in use for high performance devices, SOI wafers, each of which is obtained by bonding a bond wafer to a base wafer, have been used. These SOI wafers can be manufactured by the following method, for example. Two mirror-polished silicon wafers (a bond wafer and a base wafer) are prepared. An oxide film is formed on at least one of the wafers. These wafers are bonded together and then subjected to a heat treatment at 200 to 1200° C. to enhance bonding strength. The wafer on which devices are to be fabricated (the bond wafer) is then thinned up to a desired thickness by grinding and polishing, and an SOI wafer having an SOI layer formed therein can be thereby manufactured.

In manufacture of bonded wafers, there is another method of bonding together silicon wafers directly without being bonded through the oxide film. As the base wafer, an insulating wafer such as a quartz, silicon carbide, or alumina wafer may be used.

A surface grinding process and a surface mirror polishing process are generally performed to thin the bond wafer after bonding the bond wafer to the base wafer. When the final thickness of the bond wafer is 50 µm, for example, the surface mirror polishing process is performed with a polishing removal of 10 to 20 µm, and the thickness of the bond wafer after grinding is therefore 60 to 70 µm.

The outer circumference of the bond wafer and base wafer is usually chamfered. In the case of a general chamfer shape of a chamfer width of 350 µm, a chamfer angle of 18°, and a circular section diameter of 280 µm at its edge in a wafer having a thickness of 775 µm and a diameter of 300 mm, for example, the sectional shape of the outer circumference portion of the thinned bond wafer has a very sharp tip angle (an explementary angle) of approximately 20° in a state where the outer circumference portion of the bond wafer is not bonded to the base wafer. In surface grinding process and the subsequent processes, therefore there has been a problem in that the outer circumference portion of the bond wafer frequently chips and the bond wafer is delaminated due to the chipping as a starting point.

To inhibit such chipping at the outer circumference portion of the bond wafer, Patent Document 1 proposes a method of grinding the outer circumference portion of a bond wafer. This method includes a step of grinding the bond wafer so as to remove at least one part of the chamfered portion of a bonded interface side with respect to an outer circumference side of a predetermined width with which the outer circumference portion is to be ground, and a step of grinding the bond wafer up to a thickness of such a degree that a base wafer is not damaged with respect to the other inner circumference side of the predetermined width with which the outer circumference portion is to be ground.

Patent Document 2 proposes a method for performing a thinning process on a bond wafer after grinding to remove the exterior of a straight line that connects a point on the periphery of the chamfered portion of a base wafer and a point on the bonding surface between the bond wafer and the base wafer.

Patent Document 3 proposes a method of thinning a bond wafer by surface grinding after a bonding step and chamfering its outer circumference portion so that the chamfer angle falls in the range of 30° to 60°.

CITATION LIST

Patent Literature

Patent Document 1: Japanese Unexamined Patent publication (Kokai) No. 2006-253595
Patent Document 2: Japanese Unexamined Patent publication (Kokai) No. H03-83320
Patent Document 3: Japanese Unexamined Patent publication (Kokai) No. 2007-214256

SUMMARY OF INVENTION

In the above Patent Document 1, the generation of chipping is eliminated by the removal of the outer circumference portion of the bond wafer. However, there are also problems in that an exposed part of the base wafer referred to as a terrace is formed and reduces the area of device regions and a step at the terrace cannot be polished and this may cause particle generation during a device process.

In Patent Document 2, a device forming area can be increased, since the diameter of the base wafer does not decrease and the diameter of the bond wafer slightly decreases. In addition, the generation of chipping is easy to be inhibited during machining processes. However, the manufacturing method in Patent Document 2 is impractical because it takes a lot of time to grind a very large removal amount of the bond wafer.

Large problems in Patent Document 3 are that wafer diameter reduction due to the chamfering process cannot be avoided, the chamfer shape greatly differs from a normal chamfer shape of a chamfer angle of approximately 18°, and particles are generated at the chamfered portion during a device process.

The present invention was accomplished in view of the above-described problems, and its object is to provide a method for manufacturing a bonded wafer by which a bonded wafer with no chipping at the outer circumference portion of the thinned bond wafer, such as an SOI layer, and no delamination due to chipping as a starting point can be manufactured for a short time, while the shape of the base wafer is prevented from changing and the diameter of the bond wafer is significantly inhibited from decreasing.

To achieve this object, the present invention provides a method for manufacturing a bonded wafer comprising bonding together a bond wafer and a base wafer each having a chamfered portion at an outer circumference and thinning the bond wafer, wherein the thinning of the bond wafer includes: a first step of performing surface grinding on the bond wafer such that a thickness of the bond wafer reaches a first predetermined thickness; a second step of removing an outer circumference portion of the ground bond wafer; and a third step of performing surface grinding on the bond wafer such that the thickness of the bond wafer reaches a second predetermined thickness.

According to the method for manufacturing a bonded wafer wherein the thinning of the bond wafer includes: the first step of performing surface grinding on the bond wafer such that the thickness of the bond wafer reaches a first predetermined thickness; the second step of removing the outer circumference portion of the ground bond wafer; and the third step of performing surface grinding on the bond wafer such that the thickness of the bond wafer reaches a second predetermined thickness, the thickness of the bond wafer reaches a first predetermined thickness that enables the bond wafer to be inhibited from being chipped in the first step. In the subsequent second step, the outer circumference portion of the bond wafer is readily removed for a short time while the shape of the base wafer is prevented from changing and the diameter of the bond wafer is significantly inhibited from decreasing. As a result, the bonded wafer with no chipping at the outer circumference portion of the thinned bond wafer, such as an SOI layer, and no delamination due to chipping as a starting point can be manufactured for a short time. In the manufactured bonded wafer, reduction in device regions is also significantly inhibited.

In the first step, the first predetermined thickness is preferably set at a thickness that defines an explementary angle of 40° or more at the outer circumference of the ground bond wafer.

When the first predetermined thickness is set at a thickness that defines an explementary angle of 40° or more at the outer circumference of the ground bond wafer in the first step, the outer circumference portion of the bond wafer can be more surely inhibited from being chipped.

In the second step, the outer circumference portion of the bond wafer is preferably removed by using a chamfering wheel formed into a shape corresponding to the chamfered portion of the base wafer while a shape of the base wafer is prevented from changing.

When the outer circumference portion of the bond wafer is removed by using the chamfering wheel formed into a shape corresponding to the chamfered portion of the base wafer while the shape of the base wafer is prevented from changing in the second step, the outer circumference portion of the bond wafer alone can be removed, while the shape of the base wafer is surely prevented from changing and the diameter of the bond wafer is significantly inhibited from decreasing.

The surface grinding in the third step can be performed by using a grinding wheel with an average abrasive grain diameter smaller than that of a grinding wheel used for the surface grinding in the first step.

When the surface grinding in the third step is performed by using the grinding wheel with an average abrasive grain diameter smaller than that of the grinding wheel used for the surface grinding in the first step, grinding process time can be reduced by rough grinding in the first step and fine grinding in the third step and the bond wafer can be thinned precisely.

A mirror polishing process can be performed on the chamfered portion and the surface of the bond wafer without chemical etching after the third step.

When a mirror polishing process is performed on the chamfered portion and the surface of the bond wafer without chemical etching after the third step, manufacturing cost can be reduced by eliminating an etching process, and particles can be prevented from generating during a device fabrication process by a general mirror polishing process.

In the method for manufacturing a bonded wafer of the present invention, the thinning of the bond wafer includes: the first step of performing surface grinding on the bond wafer such that the thickness of the bond wafer reaches a first predetermined thickness; the second step of removing the outer circumference portion of the ground bond wafer; and the third step of performing surface grinding on the bond wafer such that the thickness of the bond wafer reaches a second predetermined thickness. Therefore, in the first step, the thickness of the bond wafer reaches a thick first predetermined thickness that enables the bond wafer to be inhibited from being chipped. In the subsequent second step, the outer circumference portion of the bond wafer can be readily removed for a short time while the shape of the base wafer is prevented from changing and the diameter of the bond wafer is significantly inhibited from decreasing. As a result, the bonded wafer with no chipping at the outer circumference portion of the thinned bond wafer, such as an SOI layer, and no delamination due to chipping as a starting point can be manufactured for a short time. In the manufactured bonded wafer, reduction in device regions is also significantly inhibited.

DESCRIPTION OF EMBODIMENTS

Hereinafter, embodiments of the present invention will be described by way of example, in which the bonded wafer is the SOI wafer, but the present invention is not limited to these embodiments.

In manufacture of SOI wafers having a thick thickness, a bond wafer is generally bonded to a base wafer and a surface grinding process and a surface mirror polishing process are then performed to thin the bond wafer.

The outer circumference of the bond wafer and base wafer are usually chamfered. The sectional shape of the outer circumference portion of the thinned bond wafer has a sharp tip in a state where its outer circumference portion is not bonded to the base wafer. In the surface grinding process and the subsequent processes, therefore there has been a problem in that the outer circumference portion of the bond wafer frequently chips and the bond wafer is delaminated due to the chipping as a starting point. In particular, the chipping frequently occurs in manufacture of an SOI wafer having a thick SOI layer of 50 µm or more.

Conventional methods for inhibiting the chipping at the outer circumference portion of the bond wafer have been proposed. In these conventional methods, however, there have been problems of changes in base wafer shape, reduction in SOI layer diameter, and a lot of processing time.

In view of this, the present inventor repeatedly and keenly conducted studies to solve the problems. As a result, the present inventor found that the above conventionally difficult problems of the chipping at the outer circumference portion of the bond wafer and the delamination due to the chipping upon thinning can be readily solved by the following method: the surface grinding process is divided into two steps; and a step of removing a non-bonding portion at the outer circumference portion of the bond wafer is performed between the two divided steps, in the thinning process after the bonding step of the bonded wafer such as the SOI wafer, thereby bringing the present invention to completion.

Figure 1:
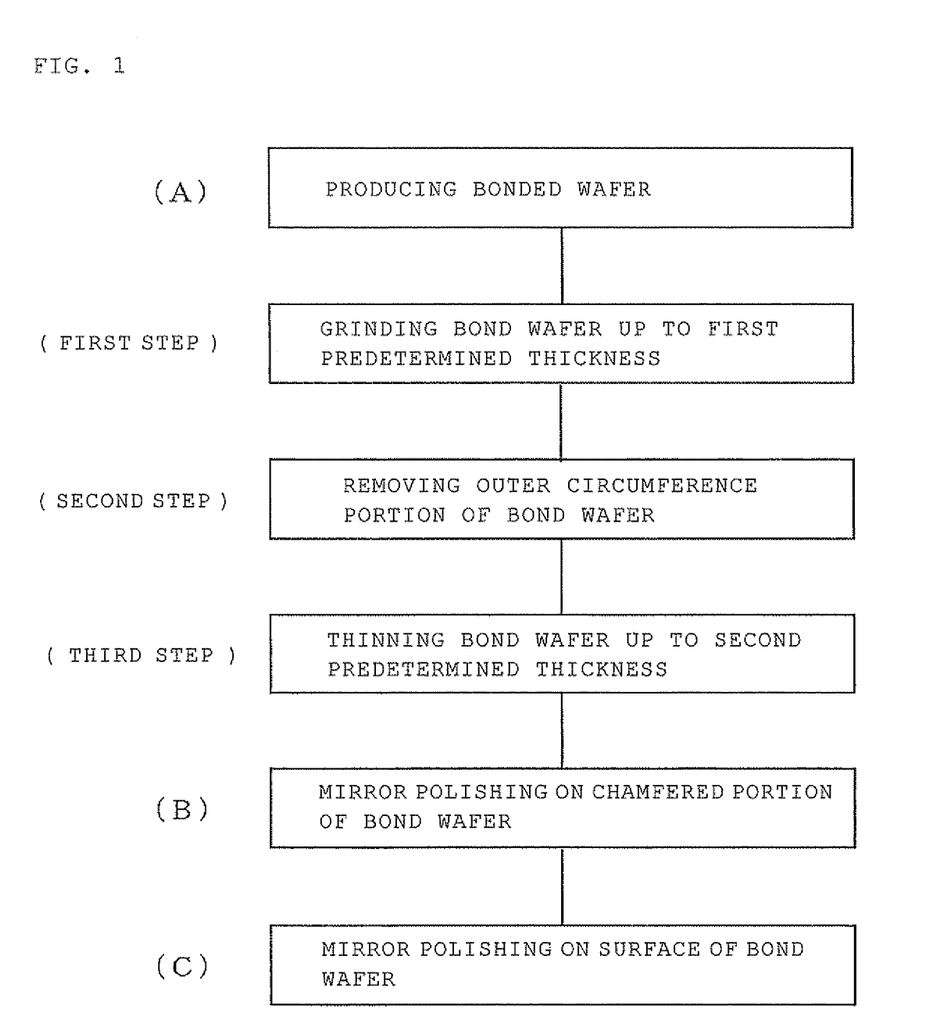
FIG. 1 is a flow chart showing an example of the method for manufacturing a bonded wafer of the present invention.

FIG. 1 is a flow chart showing an example of the method for manufacturing a bonded wafer of the present invention.

First, a base wafer and a bond wafer are prepared, bonded together, and subjected to a bonding heat treatment to produce a bonded wafer (STEP A). In this case, an SOI structure can be formed by forming an oxide film on at least one of the base wafer and the bond wafer and bonding together them. The bonding heat treatment may be performed at a temperature of 200 to 1200° C., for example.

Figure 2:
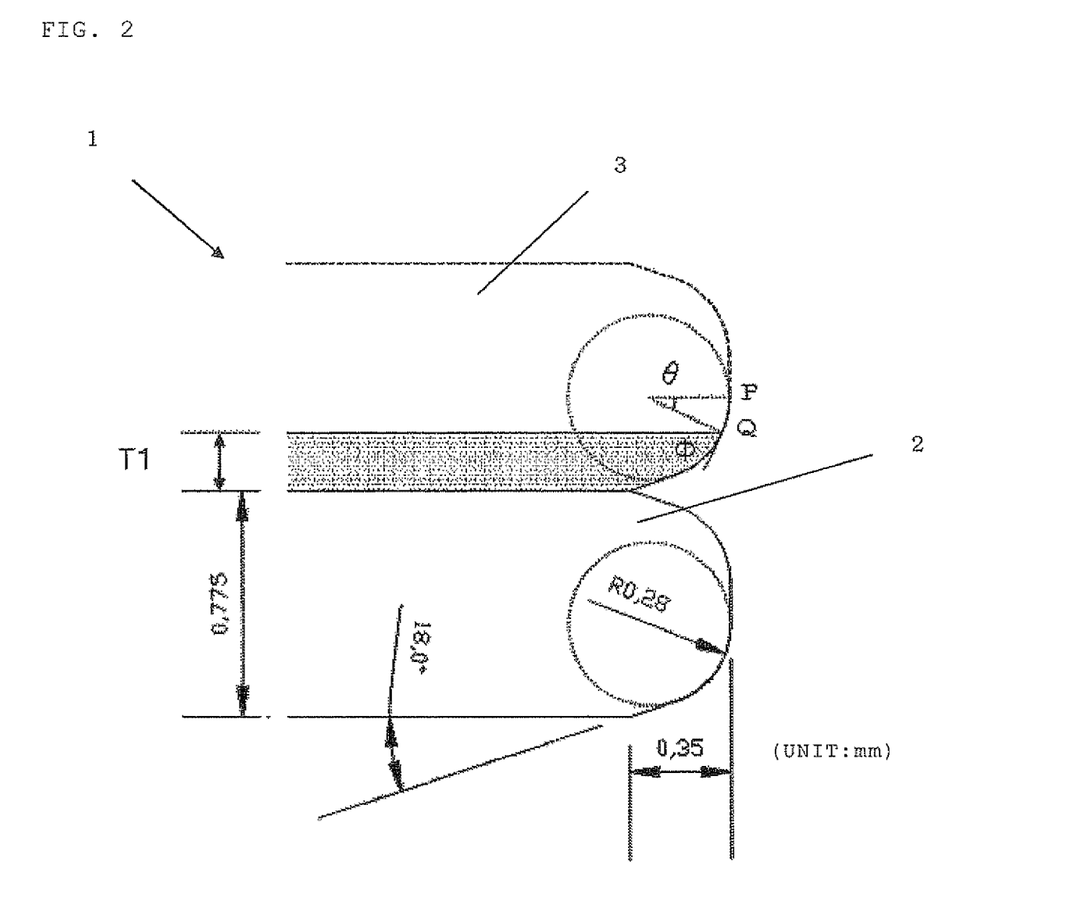
FIG. 2 is an explanatory view of an example of chamfered portions of a bond wafer and a base wafer.

FIG. 2 shows an example of the bonded wafer produced in the above way. As shown in FIG. 2, the base wafer 2 and the bond wafer 3 for use in the bonded wafer 1 are chamfered at their outer circumferences. These wafers have a standard chamfer shape for a 300-mm diameter wafer. In each of the wafers, the outer circumference portion of its surface is tapered in an outward direction, and a curved portion is formed between the tapered portion and its side surface. The thickness of these wafers is 775 μm, the taper angle is 18°, the radius of the curved portion is 280 μm, and the chamfer width is 350 μm. These values are obviously examples and should be determined according to wafer specifications. The present invention is not limited to these values.

Next, surface grinding is performed on the bond wafer 3 such that its thickness reaches a first predetermined thickness T1 (FIRST STEP). In this surface grinding, the polishing apparatus 4 shown in FIG. 3 may be used, and the back surface of a base wafer side of the bonded wafer is fixed to a rotatable vacuum chuck table 5. A grinding wheel 6 is rotated and fed in the direction of a wafer thickness from the wafer surface and a thickness sensor (not shown) is used to grind the wafer to a desired thickness. In this grinding, a grinding wheel for rough grinding can be used considering grinding time. Exemplary grinding wheel that can be used herein has an average abrasive grain diameter of 20 to 30 μm (a size of #300 to #600).

When the bond wafer 3 has been ground up to a first predetermined thickness T1, as shown in FIG. 2, the sectional shape of the outer circumference portion of the bond wafer 3 exhibits a sharp tip with an explementary angle Φ in a state where its outer circumference portion is not bonded to the base wafer 2. The explementary angle, in the case of the wafers shown in FIG. 2, means a crossing angle between a bond wafer surface (a grinding surface) and a tangent of the curved portion at the outermost point 'Q' on the bond wafer surface (the grinding surface) when the thickness of the bond wafer is T1. Here, 'P' represents a starting point of the curved portion, and 'θ' represents an angle formed by the points P and Q.

As the first predetermined thickness of the bond wafer 3 is thinner, the explementary angle Φ becomes a more acute angle. The more acute explementary angle Φ is apt to cause the chipping at the outer circumference portion. Accordingly, in the surface grinding of the first step, the first predetermined thickness is determined such that the explementary angle becomes an angle that enables the outer circumference portion of the bond wafer after surface grinding to be inhibited from being chipped.

In this manner, the chipping can be inhibited not only in the first step, but also upon the removal of the outer circumference portion of the bond wafer in the subsequent second step and the thinning of the bond wafer in the third step, and the SOI layer can be thereby prevented from being delaminated. Since the oxide film formed on the base wafer and/or the bond wafer is very thin, it is not necessary to consider the oxide film when the first predetermined thickness is determined.

Figure 4:
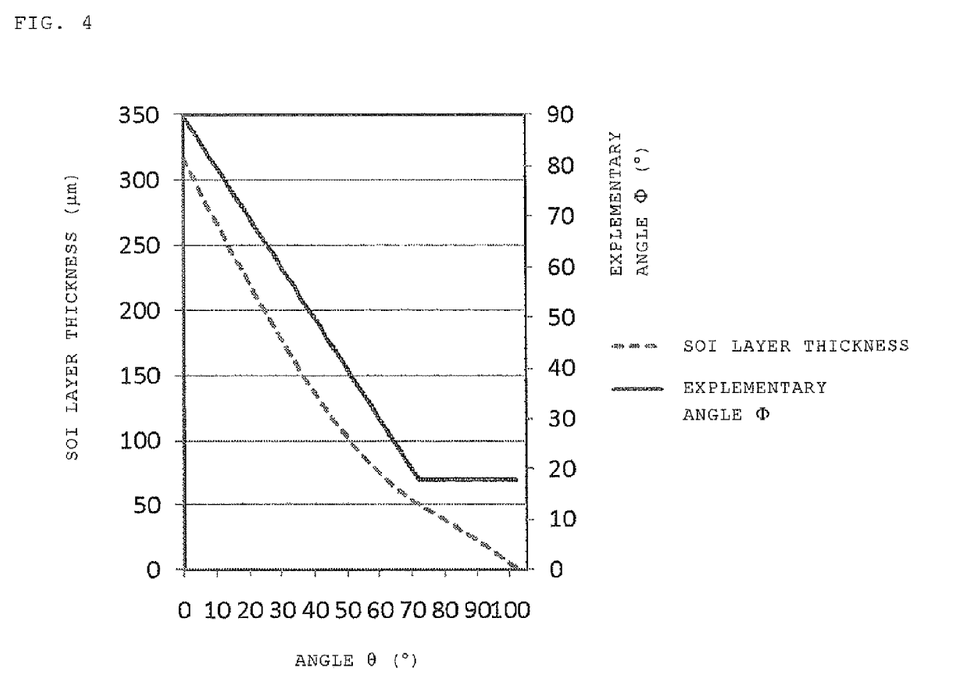
FIG. 4 is a diagram showing the relations among an SOI layer thickness, an explementary angle $\Phi$, and an angle $\theta$.

FIG. 4 is a diagram showing the relations among the SOI layer thickness (T1), the explementary angle Φ, and the above-described angle θ formed by the points P and Q when the bond wafer 3 of the bonded wafer 1 shown in FIG. 2 has been ground.

Referring to FIG. 4, as the angle θ is larger, the SOI layer thickness is thinner, and as the SOI layer thickness is thinner, the explementary angle Φ is smaller.

The present inventor conducted the later-described experiments to investigate the relations between the explementary angle Φ and the incidence of chipping at the outer circumference portion of the bond wafer when surface grinding is performed on the bond wafer 3 of the bonded wafer 1.

Specifically, the surface grinding was performed so that the explementary angle Φ and the bond wafer thickness were values shown in Table 1. The incidence of chipping at the outer circumference portion of the bond wafer in the surface grinding was then investigated.

Figure 5:
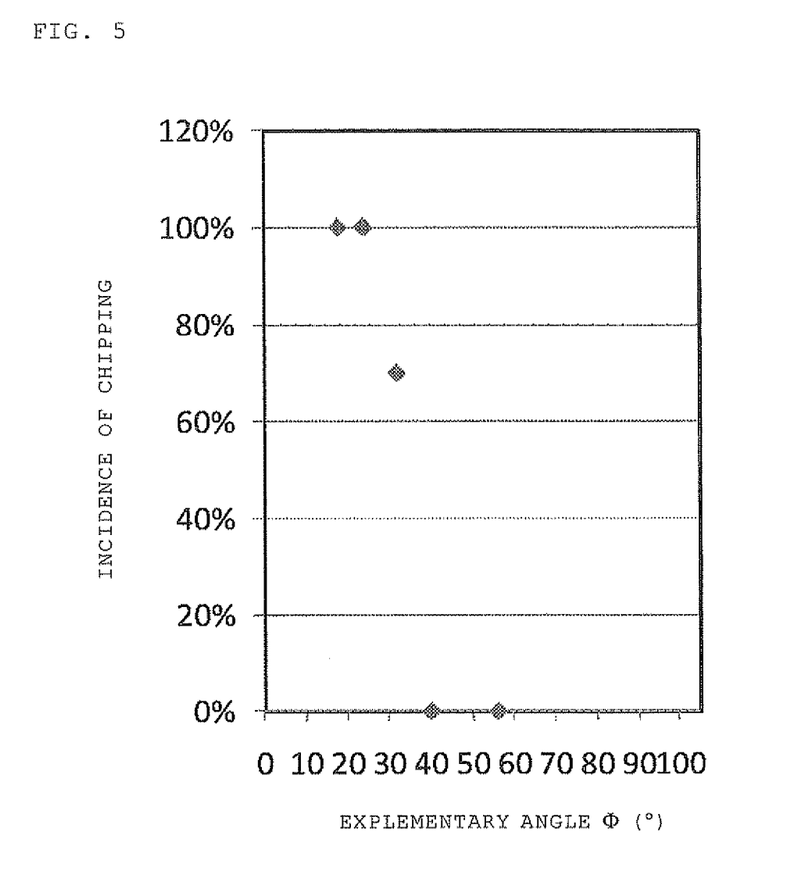
FIG. 5 is a diagram showing experiment results to investigate the relations between an explementary angle $\Phi$ and the incidence of chipping.

FIG. 5 shows the results of the relations between the explementary angle Φ and the incidence of the chipping at the outer circumference portion of the bond wafer. As shown in FIG. 5, it can be seen that when the explementary angle Φ is equal to or more than 40°, the chipping does not occur.

Therefore, when the first predetermined thickness in the first step is set at a thickness that defines an explementary angle of 40° or more for surface grinding, the chipping can be more surely inhibited in the surface grinding and the subsequent processes. The upper limit of the explementary angle Φ is not limited in particular. The explementary angle is preferably approximately 60° since a thicker first predetermined thickness increases the grinding time in the second and third steps.

TABLE 1

| | No | | | | |
|---|---|---|---|---|---|
| | 1 | 2 | 3 | 4 | 5 |
| EXPLEMENTARY ANGLE Φ (°) | 56 | 40 | 32 | 24 | 18 |
| BOND WAFER THICKNESS (μm) | 160 | 102 | 80 | 61 | 51 |

Next, the outer circumference portion of the bond wafer that has ground up to the first predetermined thickness in the first step is removed (SECOND STEP). In the method for manufacturing a bonded wafer of the present invention, as described above, the bond wafer is ground, in the first step, up to the first predetermined thickness that enables the bond wafer to be inhibited from being chipped. The bond wafer can be therefore inhibited from being chipped also in the second step. The method of the present invention also enables the outer circumference portion of the bond wafer that remains in a non-bonding state to be readily removed while the shape of the base wafer is prevented from changing and the diameter of the bond wafer is significantly inhibited from decreasing. In addition, since the removal amount of the outer circumference portion of the bond wafer is decreased, the process time can be reduced, and the bonded wafer can be thereby manufactured for a short time.

Figure 6:
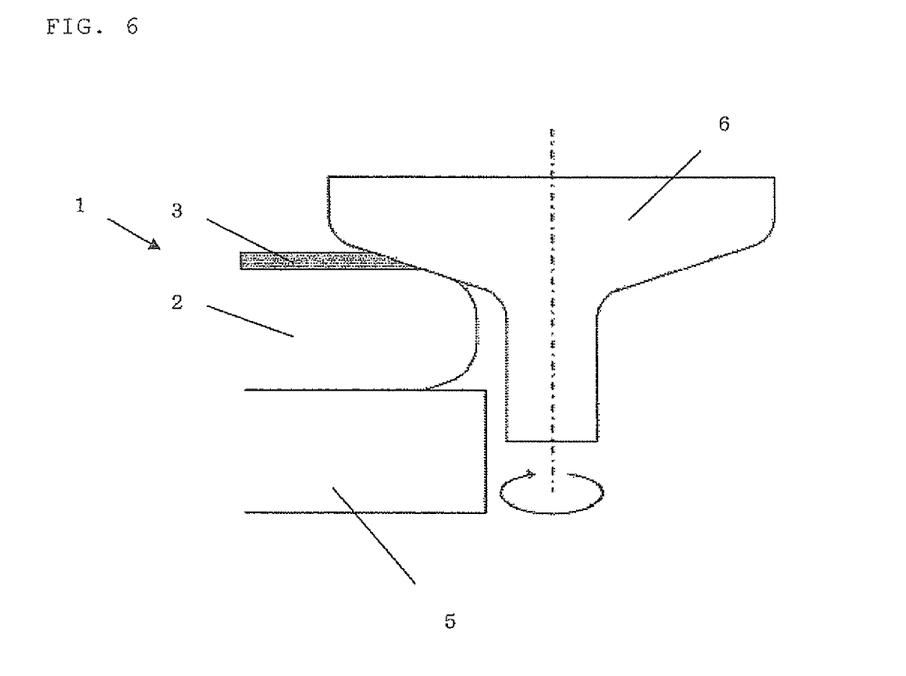
FIG. 6 is a schematic view showing an example of a grinding wheel for removing the outer circumference portion of a bond wafer, usable in the method for manufacturing a bonded wafer of the present invention.

As shown in FIG. 6, for example, a chamfering wheel 6 formed into a shape corresponding to the chamfered portion of the base wafer 2 may be used to remove the outer circumference portion of the bond wafer 3. The back surface of the base wafer side of the bonded wafer 1 is fixed to the rotatable vacuum chuck table 5, and the outer circumference portion of the bond wafer 3 alone can be ground and removed.

As described above, with the chamfering wheel 6 formed into a shape corresponding to the chamfered portion of the base wafer 2, the outer circumference portion of the bond wafer 3 alone can be removed, while the shape of the base wafer 2 is surely prevented from changing and the diameter of the bond wafer 3 is significantly inhibited from decreasing.

In the second step, the outer circumference portion of the bond wafer 3 can be removed by two-stage grinding of rough grinding and fine grinding considering its process time. For example, a grinding wheel having an average abrasive grain diameter of 8 to 15 μm (a size of #800 to #1500) can be used in the rough grinding, and a grinding wheel, having an average abrasive grain diameter of 5 μm or less (a size equal to or more than #3000) can be used in the fine grinding.

Next, surface grinding is performed on the bond wafer after removing the non-bonding corner of its outer circumference portion, and the thickness of the bond wafer is thinned and reaches a second predetermined thickness (THIRD STEP).

For example, the second predetermined thickness may be set at an SOI layer thickness prior to mirror polishing upon the thinning by the surface grinding in the third step. In this surface grinding, the polishing apparatus shown in FIG. 3 may be used as with the surface grinding in the first step, and the back surface of the base wafer side of the bonded wafer 1 is fixed to the rotatable vacuum chuck table 5. The grinding wheel 6 is rotated and fed in the direction of a wafer thickness from the wafer surface and a thickness sensor (not shown) is used to grind the wafer to a desired thickness.

Figure 3:
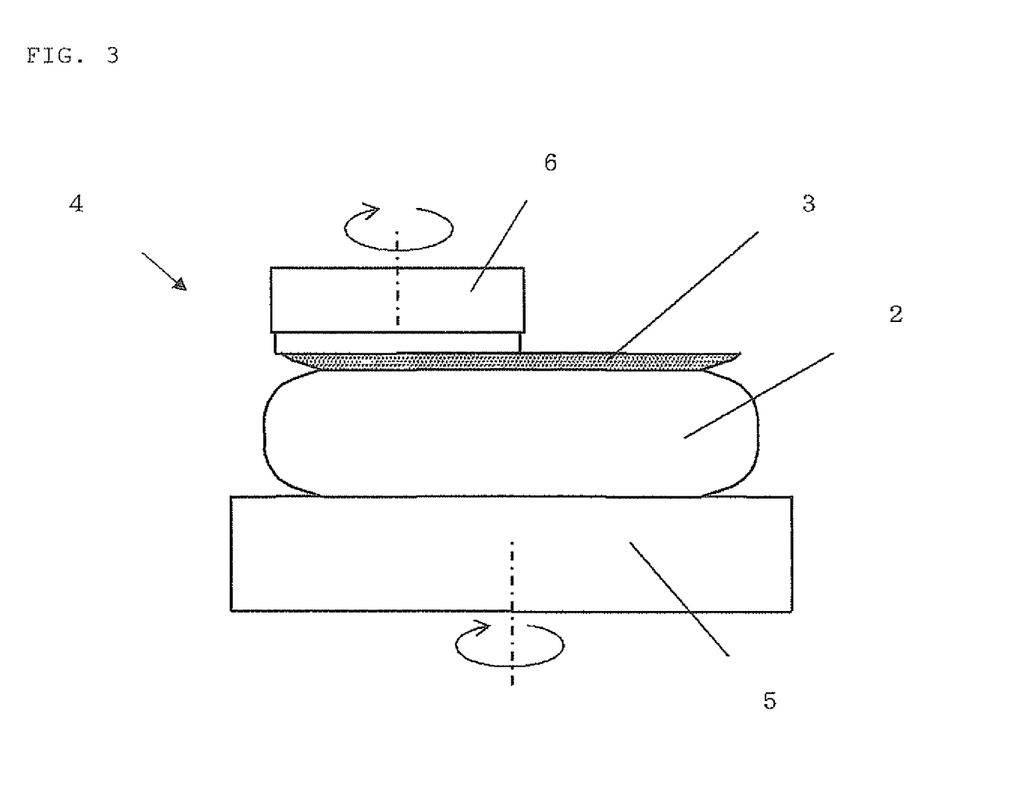
FIG. 3 is a schematic view showing an example of a grinding apparatus usable in the method for manufacturing a bonded wafer of the present invention.

In the third step, the surface grinding is preferably performed by using a grinding wheel 6 with an average abrasive grain diameter smaller than that of the grinding wheel 6 used for the surface grinding in the first step.

The grinding wheel 6 used herein preferably has an average abrasive grain diameter that realizes a smaller damage depth. For example, a desired average abrasive grain diameter is 1 μm or less (a size equal to or more than #800).

Accordingly, an SOI wafer can be obtained in which its SOI layer is thinned up to a desired thickness.

As shown in FIG. 1, a mirror polishing process can be performed on the chamfered portion at the outer circumference of the thinned bond wafer after the third step (STEP B).

According to the method for manufacturing a bonded wafer of the present invention, the sectional shape of the chambered portion at the outer circumference of the thinned bond wafer can be brought to a tapered shape without any step as shown in FIG. 6, for example. A general mirror polishing process can be therefore performed on the chamfered portion. In the step B, the chamfered portion of the base wafer may be also polished in the same time.

The surface of the thinned bond wafer may be also mirror-polished (STEP C).

The mirror polishing process on the chamfered portion and the surface of the bond wafer enables particles to be prevented from being generated in the device fabrication process. Since use of the grinding wheel shown in FIG. 6 can realize a sufficiently small damage depth, an etching process can be eliminated.

As described above, the method for manufacturing a bonded wafer of the present invention includes: the first step of performing surface grinding on the bond wafer such that the thickness of the bond wafer reaches the first predetermined thickness; the second step of removing the outer circumference portion (the chamfered portion in a non-bonding state) of the ground bond wafer; and the third step of performing surface grinding on the bond wafer such that the thickness of the bond wafer reaches the second predetermined thickness to thin the bond wafer. Therefore, in the first step, the thickness of the bond wafer reaches the first predetermined thickness that enables the bond wafer to be inhibited from being chipped. In the subsequent second step, the outer circumference portion of the bond wafer is readily removed for a short time, while the shape of the base wafer is prevented from changing and the diameter of the bond wafer is significantly inhibited from decreasing. As a result, the bonded wafer with no chipping at the outer circumference portion of the thinned bond wafer, such as the SOI layer, and no delamination due to chipping as a starting point can be manufactured for a short time. In the manufactured bonded wafer, reduction in device regions is also significantly inhibited.

Incidentally, in the above embodiments described by way of example, the bonded wafer is the SOI wafer. However, the present invention is also applicable to a directly bonded wafer, and the same effects can be achieved in this case.

EXAMPLE

The present invention will be more specifically described with reference to Example and Comparative Example, but the present invention is not limited to these examples.

Example

SOI wafers were manufactured according to the method for manufacturing a bonded wafer of the present invention shown in FIG. 1.

The final thickness of the SOI wafers being manufactured was 50 μm.

First, silicon single crystal wafers, as shown in FIG. 2, having a diameter of 300 mm, and a thickness of 775 μm were prepared as the bond wafer and base wafer. The chamfered portion of these wafers had a chamfer width of 350 μm, a chamfer angle of 18°, and a curved portion radius of 280 μm in shape. These wafers were bonded together and subjected to the bonding heat treatment to produce two bonded wafers.

Next, in the first step, surface grinding was each performed on the bond wafers of the two bonded wafers such that the thicknesses of the bond wafers reached a first predetermined thickness of 160 μm and 102 μm, respectively. As shown in Table 1, both of the first predetermined thicknesses were thicknesses that defined an explementary angle Φ of 40° or more (56° and 40°) at the outer circumference portion of the ground bond wafer.

In the surface grinding process, the polishing apparatus shown in FIG. 3 and a diamond abrasive grain #320 grinding wheel were used. As a result, the outer circumference portions of the bond wafers were not chipped.

Next, in the second step, the non-bonding portions of the outer circumference portions of the bond wafers were each removed. As shown in FIG. 6, the chamfering wheel formed into a shape corresponding to the chamfered portion of the base wafer was used to remove the outer circumference portions of the bond wafers, while the shape of the base wafers was prevented from changing. At this point, the outer circumference portions were removed by rough grinding with a #1500-size grinding wheel and the subsequent fine grinding with a #3000-size grinding wheel.

As a result, the outer circumference portions of the bond wafers were not chipped as well as the first step, and the delamination of the bond wafers due to chipping did not therefore occur.

Next, in the third step, surface grinding was each performed on the bond wafers such that the thickness of the bond wafers reached a second predetermined thickness of 60 μm. In this surface grinding process, the polishing apparatus shown in FIG. 3 and a diamond abrasive grain #8000 grinding wheel were used.

As a result, two SOI wafers with no chipping at their SOI layers and no delamination due to chipping as a starting point was able to be obtained. In the SOI wafers, the shape of the base wafers was not changed, and the reduction in its diameter was significantly inhibited.

Furthermore, a mirror polishing process was each performed on the chamfered portions and surfaces at the outer circumferences of the bond wafers so that the SOI layer thicknesses became 50 μm. In the mirror polishing process, a general mirror polishing used in silicon wafer processes was performed without chemical etching using an etching solution. There is thus no step in the sectional shape of the outer circumference portion obtained by the method for manufacturing a bonded wafer of the present invention, and the mirror polishing process can be thereby readily performed.

Comparative Example

An SOI wafer was manufactured by a conventional SOI wafer manufacturing method of removing the outer circumference portion of a bond wafer after thinning it.

The final thickness of the SOI wafer being manufactured was 50 μm as with Example.

First, the same bonded wafer as Example was produced.

Next, with the diamond abrasive grain #320 grinding wheel, surface grinding was performed on the bond wafer such that the thickness of the bond wafer reached a thickness of 90 μm. The bond wafer was further thinned up to a thickness of 60 μm by surface grinding with a diamond abrasive grain #8000 grinding wheel. The explementary angle at the outer circumference portion of the thinned bond wafer was approximately 23°.

The non-bonding portion at the outer circumference portion of the bond wafer was then removed as with Example. A mirror polishing process was performed on the chamfered portion and surface at the outer circumference of the bond wafer so that the SOI layer thickness became 50 μm, and the SOI wafer was thereby obtained.

As a result, it was confirmed that the SOI wafer manufactured by the above conventional method had the following faults.

Firstly, a lot of chipping of 0.1 to 1 mm occurred at the outer circumference portion of the bond wafer during the surface grinding in which the bond wafer was ground up to a thickness of 90 μm with the #320 grinding wheel.

Secondly, new chipping of 0.1 to 0.5 mm other than the above remaining chipping occurred during the surface grinding in which the bond wafer was ground up to a thickness of 60 μm with the #8000 grinding wheel.

Finally, the problem of the delamination of the SOI layer due to the above chipping as a starting point arose during the removal of the outer circumference portion of the bond wafer.

It was accordingly confirmed that the method in Comparative Example has a problem in that the chipping at the outer circumference portion of the bond wafer and the delamination of the SOI layer due to the chipping are easy to occur.

It was to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer comprising bonding together a bond wafer and a base wafer each having a chamfered portion at an outer circumference and thinning the bond wafer, wherein
the thinning of the bond wafer includes:
a first step of performing surface grinding on the bond wafer such that a thickness of the bond wafer reaches a first predetermined thickness, the first predetermined thickness being set at a thickness that defines an explementary angle of 40° or more at the outer circumference of the ground bond wafer;
a second step of removing an outer circumference portion of the ground bond wafer; and
a third step of performing surface grinding on the bond wafer such that the thickness of the bond wafer reaches a second predetermined thickness.

2. The method for manufacturing a bonded wafer according to claim 1, wherein, in the second step, the outer circumference portion of the bond wafer is removed by using a chamfering wheel formed into a shape corresponding to the chamfered portion of the base wafer while a shape of the base wafer is prevented from changing.

3. The method for manufacturing a bonded wafer according to claim 1, wherein, the surface grinding in the third step is performed by using a grinding wheel with an average abrasive grain diameter smaller than that of a grinding wheel used for the surface grinding in the first step.

4. The method for manufacturing a bonded wafer according to claim 2, wherein, the surface grinding in the third step is performed by using a grinding wheel with an average abrasive grain diameter smaller than that of a grinding wheel used for the surface grinding in the first step.

5. The method for manufacturing a bonded wafer according to claim 1, wherein a mirror polishing process is performed on the chamfered portion and the surface of the bond wafer without chemical etching after the third step.

6. The method for manufacturing a bonded wafer according to claim 2, wherein a mirror polishing process is performed on the chamfered portion and the surface of the bond wafer without chemical etching after the third step.

7. The method for manufacturing a bonded wafer according to claim 3, wherein a mirror polishing process is performed on the chamfered portion and the surface of the bond wafer without chemical etching after the third step.

8. The method for manufacturing a bonded wafer according to claim 4, wherein a mirror polishing process is performed on the chamfered portion and the surface of the bond wafer without chemical etching after the third step.

* * * * *